(12) United States Patent
Powell

(10) Patent No.: US 6,931,723 B1
(45) Date of Patent: Aug. 23, 2005

(54) ORGANIC DIELECTRIC ELECTRONIC INTERCONNECT STRUCTURES AND METHOD FOR MAKING

(75) Inventor: Douglas O. Powell, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/665,366

(22) Filed: Sep. 19, 2000

(51) Int. Cl.$^7$ .............................................. H05K 3/36
(52) U.S. Cl. .......................... 29/852; 29/830; 29/831; 29/846
(58) Field of Search .................... 29/830, 831, 846, 29/852; 427/96, 97

(56) References Cited

U.S. PATENT DOCUMENTS

| | | | |
|---|---|---|---|
| 3,077,511 A | * | 2/1963 | Bohrer et al. |
| 3,311,966 A | * | 4/1967 | Shaheen et al. |
| 3,464,855 A | * | 9/1969 | Shaheen et al. |
| 3,601,523 A | * | 8/1971 | Arndt |
| 4,353,957 A | * | 10/1982 | Rutt et al. |
| 4,383,363 A | * | 5/1983 | Hayakawa et al. |
| 4,854,038 A | | 8/1989 | Wiley ........................... 29/830 |
| 4,915,983 A | * | 4/1990 | Lake et al. |
| 4,921,157 A | * | 5/1990 | Dishon et al. |
| 5,075,965 A | | 12/1991 | Carey et al. .................... 29/840 |
| 5,108,785 A | | 4/1992 | Lincoln et al. ................ 427/96 |
| 5,129,142 A | | 7/1992 | Bindra et al. .................. 29/852 |
| 5,191,174 A | | 3/1993 | Chang et al. ................ 174/266 |
| 5,229,550 A | | 7/1993 | Bindra et al. ................ 174/262 |
| 5,376,326 A | * | 12/1994 | Medney et al. .............. 264/510 |
| 5,435,057 A | | 7/1995 | Bindra et al. .................. 29/830 |
| 5,481,795 A | * | 1/1996 | Hatakeyama et al. |
| 5,509,200 A | | 4/1996 | Frankeny et al. .............. 29/852 |
| 5,635,010 A | * | 6/1997 | Pepe et al. |
| 5,707,749 A | * | 1/1998 | Katagiri et al. |
| 5,729,896 A | | 3/1998 | Dalal et al. .................... 29/840 |
| 5,731,047 A | | 3/1998 | Noddin ........................ 427/555 |
| 5,744,285 A | * | 4/1998 | Felten et al. |
| 5,744,758 A | * | 4/1998 | Takenouchi et al. |
| 5,745,333 A | | 4/1998 | Frankeny et al. ........... 361/313 |
| 5,789,121 A | | 8/1998 | Cywar et al. ................... 430/9 |
| 5,822,856 A | | 10/1998 | Bhatt et al. .................... 29/832 |

(Continued)

FOREIGN PATENT DOCUMENTS

GB 2203290 * 10/1988

(Continued)

*Primary Examiner*—Eric Compton
(74) *Attorney, Agent, or Firm*—Connolly Bove Lodge & Hutz LLP; Ronald Kaschak

(57) ABSTRACT

A method for making a multi-layer electronic structure. A layer of dielectric material having a top surface and a bottom surface is provided. A layer of electrically conducting material is provided on one of the top surface and the bottom surface of the dielectric layer. At least one passage is formed through the dielectric layer to expose the layer of electrically conducting material. Electrically conducting material is deposited in at least one of the at least one passage through the dielectric layer. Portions of the layer of electrically conducting material are removed to define a pattern of circuitry. A stack is formed of plurality of structures including the layer of dielectric material and layer of electrically conducting material. The plurality of structures are aligned and joined together. Spaces between the structures are filled with electrically insulating material.

57 Claims, 4 Drawing Sheets

U.S. PATENT DOCUMENTS

| | | | | |
|---|---|---|---|---|
| 5,837,119 A | * | 11/1998 | Kang et al. | 205/74 |
| 5,841,099 A | | 11/1998 | Owen et al. | 219/121.69 |
| 5,876,842 A | | 3/1999 | Duffy et al. | 428/209 |
| 6,054,761 A | * | 4/2000 | McCormack et al. | 257/698 |

FOREIGN PATENT DOCUMENTS

| | | |
|---|---|---|
| JP | 8274466 A | 10/1996 |
| WO | WO 9820537 A | 5/1998 |

\* cited by examiner

ORGANIC DIELECTRIC ELECTRONIC INTERCONNECT STRUCTURES AND METHOD FOR MAKING

FIELD OF THE INVENTION

The present invention relates to interconnect structures for use in electronic devices and equipment, and methods for making the interconnect structures.

BACKGROUND OF THE INVENTION

A variety of structures are utilized in a supporting capacity for electronic devices. For example, integrated circuit chips may be mounted on chip carriers. According to another example, printed wiring boards are utilized for mounting an interconnecting wide array of components that typically make up electronic products. Other examples include patches or appliqués that can be joined to lower density interconnect structures, such as traditional printed wiring boards. As with other elements of semiconductor devices and associated structures, supporting structures are affected by increases in feature density and decreases in feature size.

SUMMARY OF THE INVENTION

The present invention provides a method for making a multi-layer electronic structure. The method includes providing a layer of dielectric material having a top surface and a bottom surface. A layer of electrically conducting material is provided on one of the top surface and the bottom surface of a dielectric layer. At least one passage is formed through the dielectric layer to expose the layer of electrically conducting material. Electrically conducting material is deposited in at least one of the at least one passage through the dielectric layer. Portions of the layer of electrically conducting material are removed to define the pattern of circuitry. A plurality of structures including the layer of dielectric material and layer of electrically conducting material are stacked on top of each other. The plurality of structures are aligned and joined together. Spaces between the structures are filled with electrically insulating material.

The present invention also includes a multi-layer electronic structure. The structure includes at least two substructures joined together. Each substructure includes a layer of dielectric material having a top surface and a bottom surface, a pattern of circuitry on one of the top surface and the bottom surface of the layer of dielectric material, and at least one passage through the dielectric layer in connection with the circuitry. The at least one passage is filled with electrically conducting material. The at least two substructures are stacked on each other such that one of the electrically conducting material filling the at least one passage and the circuitry pattern on one substructure contacts and is electrically conductively joined to one of the electrically conducting material filling the at least one passage and the circuitry pattern on another substructure. Electrically insulating material substantially fills a space between facing substructures except between a joined filled passage and a circuitry pattern.

Additionally, the present invention provides an electronic package. The electronic package includes a multi-layer structure including at least two prefabricated substructures joined together. Each substructure includes a layer of dielectric material having a top surface and a bottom surface, a pattern of circuitry on one of the top surface and the bottom surface of the layer of dielectric material and at least one passage through the dielectric layer in connection with the circuitry. At least one of the at least one passages is filled with electrically conducting material. The at least two substructures are stacked on each other such that the circuitry patterns do not face each other and such that at least one passage in each substructure contacts and is joined to the circuitry pattern on another substructure. Electrically insulating material is arranged between facing substructures except between a joined filled passage and a circuitry pattern. A semiconductor chip is attached to the multi-layer structure.

Furthermore, the present invention provides an electronic packaging including a printed wiring board including at least two prefabricated substructures joined together. Each substructure includes a layer of dielectric material having a top surface and a bottom surface, a pattern of circuitry on one of the top surface and the bottom surface of the layer of dielectric material and at least one passage through the dielectric layer in connection with the circuitry. At least one of the at least one passages is filled with electrically conducting material. The at least two substructures are stacked on each other such that the circuitry patterns do not face each other and such that at least one passage in each substructure contacts and is joined to the circuitry pattern on another substructure. Electrically insulating material is arranged between facing substructures except between a joined filled passage and a circuitry pattern. A plurality of electronic components is attached to the printed wiring board.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

Figure 1:
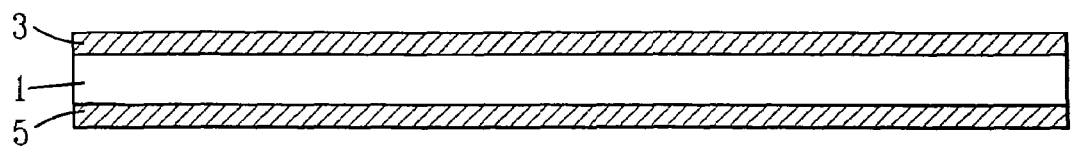
FIGS. 1–8 represent cross sectional views of an embodiment of a substructure according to the present invention at various stages of an embodiment of a process for manufacturing the substructure according to the present invention.

The present invention provides an electronic interconnect structure and a method of making the structure. Such interconnect structures typically are utilized in integrated circuit packages as substrates, such as chip carriers; as printed wiring boards; for mounting and interconnecting various components, such as integrated circuits, resistors, capacitors, discrete semiconductor devices, among other structures; and as high density interconnect patches or appliqués. The structures according to the present invention are also useful as substrates in single chip and multi chip semiconductor integrated circuit packages. Such structures typically include plated through holes (PTH's) to make interconnections between circuit features on different layers.

One disadvantage of plated through holes is that they exclude an area from use for interconnect wiring. This excluded area includes a tolerance circle. The tolerance circle typically is determined by the uncertainty of the hole locations relative to the circuitry.

This disadvantage relative to plated through holes increase as circuit density increases and feature size decreases. Along these lines, the area fraction excluded by plated through holes increases as feature size decreases. This is at least in part a result of the inability to scale the exclusion circle proportionately to reduction in size of other circuit features. The problems related to plated through holes in particular limits the achievable increases in circuit density.

One alternative to address the above-discussed problems is a sequential build-up (SBU) micro-via technologies, such as surface laminar circuit (SLC). SBU micro-via technologies can reduce or eliminate the need for plated through holes in interlayer connections. This can permit higher interconnect densities than plated through holes.

However, the sequential nature of SBU processes has a number of associated disadvantages. Among the disadvantages are cumulative yield losses for each additional layer added to the previous layer structure. Additionally, SBU processes are associated with long cycle times since layers are added in sequence.

Another solution developed to address the above-described problems includes thermo-compression bonding of gold clad surfaces. While gold bonding can provide a highly reliable metallurgical bond, the joining process requires high temperatures and pressures. This limits the choice of materials available for construction. Additionally, joining yields are negatively impacted by factors such as surface cleanliness and the ability to provide uniform pressures at all of the different joint positions to be bonded. Furthermore, the use of gold greatly increases the costs of such methods.

Yet another process involved in addressing the above-described problems includes conductive paste bonding. The most common conductive pastes include conductive particles or flakes in a resin binder. These pastes depend on particle-to-particle and particle-to-circuit feature contacts to maintain electrical conductivity. No metallurgical bonds exist to hold the joint together.

Reliable operation over the product lifetime typically requires that the conductive paste portion of each joint be maintained and compressed to maintain good particle contact. Fabricating circuit layers and/or bonding plies to assure high joining yield while conforming to other process or product constraints presents many challenges. High joining yield may require paste "slugs" to be crowned or dielectric shrunk in the out of plane direction during joining. Process and product constraints can include layer registration tolerance and dimensional stability, low out of plane expansion in the plane of the joints, and adequate surface cleanliness for good joint conductivity, among others. As a result of these problems, conductive paste bonding can result in low yields and/or high costs.

Since there is no metallurgical bond with the circuit features when utilizing such bonding, the interfaces may be susceptible to oxidation. Also, the interfaces may be susceptible to corrosion if there is a diffusion path for moisture to the interfaces. Along these lines, totally excluding moisture is extremely difficult in organic structures.

To address some of the above-described problems, new conductive pastes are being developed that do provide metallurgical bonds. In these pastes, the conductive particles typically include a solid solder alloy or are coated with a solder alloy. The solder or solder alloy may include, for example, tin, tin/lead, tin/bismuth, and other metals and/or alloys. At sufficiently high temperatures, typically less than about 240θ C., the particles may metallurgically join to each other as well as the circuit features to be joined. The resin binders for these materials are typically thermosetting polymers that are designed to cure at about the same temperature as required for the metallurgical bonding.

However, problems are associated with these newer types of conductive pastes. Among the problems, is that many such pastes require an extremely rapid heat up profile during joining in order to permit proper metallurgical joining before the thermosetting resin becomes too rigid. It is difficult to obtain the necessary heating rates throughout a multi-layer structure.

Second, wetting and bonding to the surface of the circuit features requires a flux to remove oxides from the surface of the circuit features and the conductive particles. This effectively requires that the flux be a part of the paste binder system. The action of the flux when it chemically reduces the surface oxides also results in gases that must be eliminated from the structure. This can cause voiding or foaming of the binder paste.

Also, all fluxes typically leave residues. Such residues can not be cleaned, particularly due to the nature of the structures, which include large planes with a very small gaps. Effective fluxes that provide benign residues for this type of application are yet to be developed. In spite of this, the newer conductive pastes described above still have the requirement to provide some type of crowning or out of plane shrinkage in order to assure adequate contact for good joining yields.

The present invention provides a solution to the above-described and other problems by providing a multi-layer electronic structure. The multi-layer structure includes at least two fabricated substructures joined together.

According to one embodiment of a method for making a multi-layer structure according to the present invention, a layer of dielectric material having a top surface and a bottom surface is provided. Any dielectric material may be utilized in this application. Examples of dielectric materials that may be utilized here typically include materials commonly sold and used in the printed wiring board and flexible circuit industries, including organic substrates for integrated circuit packaging known to those of ordinary skill in the art.

Typically, the dielectrics utilized according to the present invention are those that have sufficient structural integrity to allow handling during processing without benefit of a supporting carrier film or foil. These are primarily the fiber-reinforced or self-supporting dielectrics. Of the fiber-reinforced dielectrics, non-glass fibers typically are utilized, since it is easier to form via openings in these materials with laser, plasma, or chemical etching processes.

Specific examples of the type of dielectrics that may be employed according to the present invention include:

Polymer Resins, Examples Including:
    Epoxy;
    Cyanate Ester;

bismaleimide triazine (BT)—typically blended with epoxy resins
polyphenylene oxide (PPO)—typically blended with epoxy resins, having the trade name GETEK;
allylated polyphenylene ether (APPE);
Fluoropolymer—trade name: Teflon
  polytetrafluoroethylene (PTFE);
  fluorinated ethylene propylene copolymer (FEP);
  perfluoroalkoxy (PFA)
  copolymer of ethylene and PTFE (ETFE);
Polyimide;
Polyester;
liquid crystal polymer (LCP);
Epoxy Acrylate (acrylated epoxy);
Butyl Rubber; and
Mixtures of any one or more of the above;

Fiber Reinforced Polymer Resins, Examples Including:
  Fiber reinforcement types, examples including:
    Woven cloth;
    Non-woven mats or paper;
    Short or micro fibers;
  Fiber materials, examples including:
    Glass;
    Aramid;
    liquid crystal polymer (LCP);
  Resins, examples including:
    All of the above except polyester and LCP.
  Available Forms of the dielectric, whether one of the above or another can include:
  Dielectric sheets
    Themoset resin types (epoxy, cyanate ester, BT, APPE, polyimide, butyl rubber) with partially cured (B-stage) resin—These are known in the industry as "prepreg";
  Sheets with metal foil (almost always copper) laminated to one or both sides.

Self-Supporting Dielectric Films, Examples Including:
  Resin types:
    Polyimides;
    Polyesters;
    LCP's;
    Fluoropolymers;
  Available forms:
    Bare dielectric;
    Metallized (almost always copper) one or both sides;
      Laminated foil;
      Adhesive bonded (epoxy, acrylic, epoxy/acrylic, phenolic butyral, thermoplastic, etc. adhesives);
      Adhesiveless;
      Plated;
        May have adhesion layer of chromium, nickel, etc.;
      Vacuum deposited;
        May have adhesion layer of chromium, nickel, etc.

Resin Coated on a Carrier
  Carriers:
    Copper Foil (referred to as RCC—resin coated copper), foils of other metals also possible;
    Polymer Film (usually polyester);
  Unfilled or particulate filled resins;
    Filler is typically inorganic and non-metallic (silicon dioxide is most common).

Interpenetrating Network of Expanded PTFE and Thermosetting Resin (Epoxy, cyanate ester, BT, etc.).
  The above dielectrics may be obtained from, among other suppliers:

Prepreg and Copper Clad Fiber Reinforced Dielectrics:
  GE Electrochemicals;
  Isola Laminate Systems;
  Matsushita Electronic Materials, Inc.;
  Mitsubishi International Corp.;
  Park/Nelco;
  Polyclad Laminates, Inc.;
Un-metallized Dielectric Films;
  E.I. DuPont de Nemours and Co. (Kapton brand polyimide film);
  UBE Industries, Ltd. (Upilex brand polyimide film);
  Kaneka High-Tech Materials, Inc. (Apical brand polyimide film);
  Kurary Co., Ltd. (LCP film);
Metallized Dielectric Films;
  Rogers Corp.;
  Gould Electronics, Inc.;
  Sheldahl, Inc.;
Resin Coated Copper
  Isola Laminate Systems;
  Polyclad Laminates, Inc.;
  Asahi Chemical Industry Co., Ltd.;
Expanded PTFE/Thermoset
  W. L. Gore and Associates (Speedboard and Microlam brands).

However, the dielectric material may be any material typically utilized as clad laminate materials in the printed wiring board industry or base material in the flex circuit industry. Typically, whatever material is utilized, it has characteristics such that a sheet or film of the material has sufficient mechanical integrity to support conductive circuit features formed thereon and that it not suffer detrimental effects at the required joining temperatures. Other characteristics that may be important in selecting the dielectric material are electrical characteristics, such as dielectric constant and loss, mechanical properties, thermal properties, dimensional stability, among others. Typically, these other properties are optimized after determining that the sheet of the dielectric has sufficient mechanical integrity and temperature resistance.

The layer of dielectric 1 illustrated in FIG. 1 may have a thickness of about 0.0005 inch to about 0.0100 inch. However, any desired thickness may be utilized. The thickness and electrical performance characteristics of the finished product may factor into the thickness of the dielectric layer utilized here.

Also, in typical applications, the dielectric layer, or sheet, may have a length and width of about 0.5 inch to about 36 inches. In some applications, a sheet having a length and width greater than single finished product may be utilized. According to such embodiments, at some point during the process, the substructures or structure made of the substructures may be separated into units having smaller lengths and widths.

The dielectric material may include a free standing organic film, fiber reinforced resin sheet, particulate filled fluoropolymer sheet, resin filled expanded fluoropolymer sheet, or liquid crystal polymer film. If the dielectric material includes a free-standing organic film, the film may be a polyimide film. The polyimide film could be a KAPTON or UPILEX film. In the event that the dielectric layer include a fiber reinforced resin sheet, the fiber reinforced resin sheet can include glass and/or aramid fibers. Regardless of the composition of the fiber in the reinforced resin sheet, the fiber reinforcement may be woven or non-woven.

After providing the layer of dielectric material, a layer of electrically conductive material may be provided on at least of the top surface and the bottom surface of the dielectric layer. The layer of electrically conducting material may be provided on only one of the top surface and the bottom surface of the dielectric layer. Alternatively, the electrically conducting material may be provided on both the top surface and the bottom surface of a layer of dielectric material.

FIG. 1 illustrates a cross-sectional view of an embodiment of a substructure according to the present invention at one stage of a method according to the present invention for forming the substructure. The substructure illustrated in FIG. 1 includes a dielectric layer 1 with a layer of electrically conducting material 3 on the top surface and the bottom surface of the dielectric layer.

While any electrically conducting material may be utilized for the layer of electrically conducting material 3, typically, the electrically conducting material is patternable. Also, typically, the electrically conducting material is solderable or can have a solderable surface layer applied thereto.

In accordance with the above, the layer of the electrically conducting material may include at least one metal. One metal that may be utilized in electrically conducting layer is copper. In the event that copper is utilized as the electrically conducting material, the copper applied to the dielectric layer may be pure or substantially pure. Along these lines, the copper may include small amounts such as about 5% of one of more impurities. The impurities may be functional. Other metals that could be utilized include aluminum, silver, gold, platinum, palladium, and nickel. Advantages of copper include high electrical conductivity, low cost, processability including ease of plating and etching, strength, ductility, solderability, thermal stability including high melting point and no low temperature phase transitions, low magnetic permeability, and resistance to electromigration.

The metal layer could have at least one thin surface layer of at least one other metal, either at the dielectric interface or the free surface. For example chromium, nickel or some other metal or alloy could be used as in adhesion layer between the dielectric and the copper. This is especially likely for the case of vacuum deposited metal on a self-supporting dielectric film. Such materials are available commercially. For example, Gould Electronics offers copper metallized polyimide with chromium or nickel alloy adhesion layers under the trade name Gouldflex. Free surface metal layers could be used to enhance or inhibit solderability, provide corrosion resistance, or improved adhesion to the resin used to fill interlayer gaps after joining. Examples of possible surface coating layers include chromium to inhibit solder wetting where it is not subsequently removed and/or improve adhesion to the fill resin, nickel/gold for corrosion resistance and enhanced solder wettability, tin, nickel, cobalt, tin/nickel alloy, tin/cobalt alloy, silver, and others. Such surface and interface layers are known to those of ordinary skill in the art and, thus, will not be discussed here in greater detail. Various combinations of the above, or none at all, can be used based on considerations of processing convenience, yield, cost, application requirements, among other factors.

The electrically conducting material may be provided in a variety of ways. For example, the electrically conducting material may be provided by laminating a sheet of electrically conducting material on the dielectric layer. According to one embodiment, where the electrically conducting material is copper, a copper foil may be laminated to the dielectric material.

For the case where the dielectric contains uncured or partially cured (B staged) thermosetting resin, or contains a thermoplastic resin, foil can usually be bonded directly to the dielectric by lamination without a separate adhesive layer. This is common industrial practice. Often the foil will have a surface treatment that provides higher roughness and surface area on the side of the foil to be bonded. These foil surface treatments are typically proprietary to the foil suppliers, but their use is well known to those of ordinary skill in the art. The presence of this roughness on the side of the foil bonded to the dielectric can be used to advantage in the present invention if the starting material or one of the early intermediate structures is a dielectric sheet that has had foil laminated to both sides.

The lamination process typically replicates the foil surface topography on the dielectric side of the interface, and when the foil is etched away from the non-circuit side of the structure, a roughened surface will be left on the dielectric. This roughened surface will provide improved adhesion to the resin used to fill the interlayer gaps between structures after joining. A double sided, copper clad laminate has the advantage of having a rough, high area, surface, that will eventually need to bond with the infused liquid resin, after etching the laminated foil.

For the case where foil is laminated to a non-flowable dielectric layer, for example, polyimide or polyester film, it is common industry practice to employ an adhesive layer between the foil and dielectric. Common adhesives can include epoxy, acrylic, epoxy/acrylic, phenolic butyral, thermoplastic fluoropolymers, among others. A wide variety of such materials is available commercially. For example, Rogers Corp, supplies polyimide films bonded to copper foil with several different adhesives under the trade name R/flex.

Many methods of disposing metals on dielectrics, or dielectrics on metals, are known to those of ordinary skill in the art.

The electrically conducting material may also be applied to the dielectric layer by physical vapor deposition (PVD), plating, and/or chemical vapor deposition (CVD), among other processes. In the event that physical vapor deposition is utilized to deposit the electrically conducting material, the physical vapor deposition may include vacuum evaporation or sputtering. On the other hand, where plating is utilized, the plating may be electroplating or electroless plating. Those of ordinary skill in the art would know how to carry out any of the deposition processes mentioned above to provide the electrically conducting layer without undue experimentation, once aware of the present disclosure.

According to an alternative embodiment, rather than applying electrically conducting material to a layer of dielectric material, a layer of dielectric material may be provided by applying dielectric material to a layer of electrically conducting material. In this embodiment, electrically conducting material may include any electrically conducting material. For example, electrically conducting material may include a copper foil. However, any metal and/or alloy that may be provided as a layer or sheet may utilized here.

The dielectric material may be applied to the electrically conductive material by a variety of methods. The methods can include screening, slot coating, curtain coating, doctor blading, roll coating, rod coating, dip coating, and/or spraying. Any dielectric material may be utilized in this embodiment, including those discussed above. Those of ordinary skill in the art would know how to apply to the dielectric material to the electrically conducting material according to one of the above or other methods without undue experimentation once aware of the present disclosure.

Some other possible methods can include dip coating, spin coating, and dry-film lamination. Dry film lamination could be carried out, for example, with materials like DynaVia 2000 available from Shipley Co., L.L.P., a subsidiary of Rohm and Haas.

After creating a structure that includes a layer of dielectric material and at least one layer of electrically conducting material, a layer of photoresist may be applied to at least one side of the laminate that includes the dielectric and electrically conducting material. Typically, the photoresist is applied on one of the layer(s) of electrically conducting material.

After forming the laminate including the layer of dielectric material and at least one layer of electrically conducting material, at least one passage is formed through the layer of dielectric material to expose at least one portion of the layer of electrically conducting material. If a layer of electrically conducting material is present on both sides of the layer of dielectric material, forming passages through the dielectric material may require removing one of the layers of electrically conducting material.

If the laminate is similar to the laminate illustrated in FIG. 1, one of the layers of electrically conductive material will need to be removed before passages can be formed in the dielectric layer. While this may seem to represent a needless step of removing a layer, one of the electrically conducting layers, this may actually simplify the process and reduce associated costs. This simplification and cost reduction can be realized by utilizing commonly available materials. These include double-sided, copper-clad laminates commonly utilized in the printed wiring board industry. Such materials also include copper clad films commonly utilized in the flex circuit industry.

By utilizing commonly available materials, the present invention can reduce costs. Additionally, double-sided copper clad laminates have the advantage of having a rough, high area surface that may eventually need to bond with an infused liquid resin after etching a laminated foil as described below in greater detail. Of course, it is not necessary to use prefabricated structures and such structures could be fabricated as part of the present invention, whether they include one or two layers of electrically conducting material.

As stated above, in the event that a double sided laminate is utilized such as that illustrated in FIG. 1, one of the layers of electrically conductive material may need to be removed. Prior to removing one of the layers of electrically conducting material, a removable protective coating, such as photoresist, may be provided on one of the layers of electrically conductive material. The protective coating may protect the electrically conducting material on which a circuit pattern is to be formed. The protective coating may also permit removal, or etching, of the other layer of electrically conducting material from the other side of the layer of dielectric material. Furthermore, the protective material may also protect the electrically conducting material it covers from handling damage prior to circuit patterning. Still further, the protective material may act as a plating resist if dielectric via holes are to be filled with conductive material by a plating process.

Figure 2:
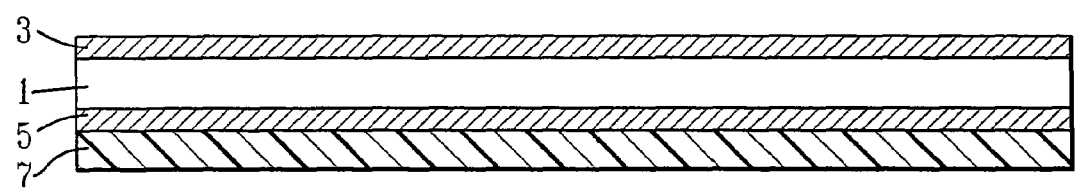
Figure 3:
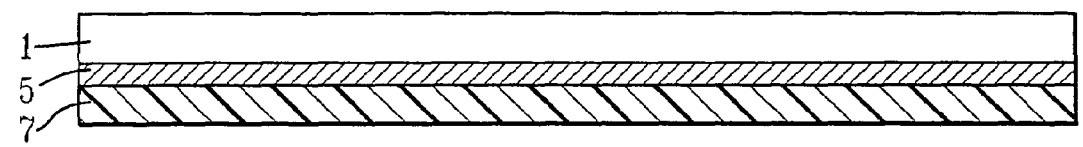

FIG. 2 illustrates a double sided laminate on which a layer of photoresist 7 has been applied to one of the layers 5 of electrically conducting material. After providing the protective layer 7, the layer of metal not covered by the protective material may be removed. FIG. 3 illustrates the resulting structure. Any commonly known technique may be utilized for removing the non-protected layer of electrically conducting material.

When one side of the dielectric layer is exposed, which may require removing one of the layers of electrically conducting material, at least one passage may be formed in the dielectric layer. These passage(s) represent via holes through the dielectric. Any number of processes may be utilized for forming the via holes. Typically, the passages are formed by laser drilling. However, other processes may be utilized. For example, plasma etching may be utilized to form holes in the dielectric. Other potential methods can include employing a photoimageable dielectric, for example Shipley Co.'s DynaVia 2000 or MULTIPOSIT 2000, or to chemically etch the dielectric after applying and photolithographically patterning a resist layer on top of the dielectric layer. Plasma etching also makes use of a patterned resist layer. Mechanical or other drilling techniques might also possibly be utilized.

Figure 4:
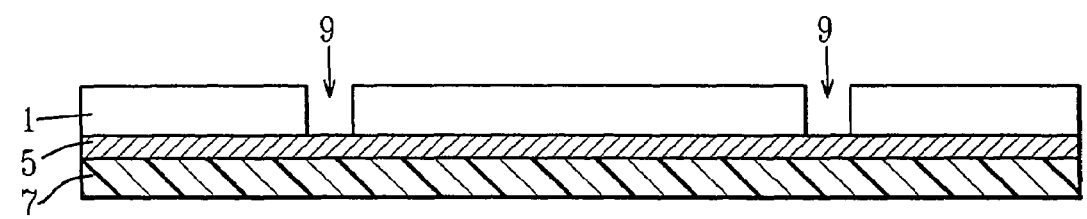

FIG. 4 illustrates an embodiment of the present invention in which passages 9 have been formed in the dielectric layer 1. Any number of passages may be formed in any pattern and have any size. Formation of the passage(s) exposes portion(s) of the layer of electrically conducting material as illustrated in FIG. 4.

After forming the at least one passage in the dielectric layer, electrically conducting material may be deposited in at least one of the passages in the dielectric layer. Depositing electrically conducting material in the passages forms an electrical connection through the dielectric layer.

Electrically conducting material deposited in at least one of the at least one passages through the dielectric layer may not extend above the upper surface of the dielectric layer. Alternatively, the electrically conducting material filling the passages may extend above the surface of the dielectric layer. Typically, if the electrically conducting material extends above the surface of the dielectric, it extends only slightly. This may help ensure good contact during joining of such structures. According to such embodiments, the electrically conducting material may extend above the surface of the dielectric layer a distance up to about 0.001 inch.

A variety of electrically conducting materials may be utilized. Also, the electrically conducting material utilized to fill the passages in the dielectric layer may be deposited utilizing any of a variety of methods. For example, the material may include a metal or alloy. Typically the metal is copper. Other possible metals include nickel, gold, silver, tin, solder alloys containing tin, lead, bismuth, indium, antimony, silver, copper, among others, or alloys containing two or more of these metals. Typically, the metals and alloys can be plated by electroplating or electroless plating or can be deposited as a liquid, that is, have a melting point below about 300° C.

The metal or alloy may be plated in the passage(s). The plating may be electroplating or electroless plating. Regardless of how the electrically conducting material is provided, it may be provided in any one or all of the passages in the dielectric. Electrically conducting material may not be deposited in some of the passages.

Alternatively, the electrically conductive material could be a conductive paste. Conductive pastes typically include conductive particles dispersed in an organic resin, optionally also containing some solvent for the organic resin. Conductive particles can be metal powders or flakes, or alternatively they can be metal-coated dielectric particles. If the metals employed are non-fusible at acceptable processing temperatures, such as below about 300° C., then they must be present in a volume fraction greater than the percolation threshold, or the point at which particle to particle contact is guaranteed. If at least some) of the conductive material is a low melting metal or alloy, such as having a melting point on the order of below about 300° C., then heat can be used during the curing process of the conductive paste, causing metallurgical bonding between conductive paste particles and/or to metal surfaces in contact with the paste. The final structure may be an interpenetrating network of conductive material and dielectric material, such as one or more resins. The organic resin, if utilized, could be either a thermosetting material (epoxy is the most common) or a thermoplastic material (polyimide siloxane is one that has been used).

Examples of conductive pastes that may be utilized to fill the passages include that described by U.S. Pat. No. 5,744,285, the entire contents of the disclosure of which is hereby incorporated by reference. U.S. Pat. No. 5,744,285 describes a conductive paste containing silver and silver-coated copper conductive particles in an epoxy resin. Another conductive paste is described by U.S. Pat. No. 5,062,896, the entire contents of the disclosure of which is hereby incorporated by reference. U.S. Pat. No. 5,062,896 describes a conductive paste containing solder alloy, specifically tin/bismuth solder, in a thermoplastic polyimide siloxane resin. Other conductive pastes are described by U.S. Pat. Nos. 5,948,533, 5,376,403, 5,538,789, 5,716,663, and 5,830,389, the entire contents of the disclosures of which are hereby incorporated by reference. These patents describe conductive pastes that include both copper and solder conductive particles in a thermosetting resin. Furthermore, U.S. Pat. No. 6,054,761, the entire contents of the disclosure of which is hereby incorporated by reference, describes a conductive paste with mixed fusible and non-fusible conductive particles in an epoxy resin. Still further, U.S. Pat. No. 6,059,952, the entire contents of the disclosure of which is hereby incorporated by reference, describes a conductive paste with copper conductive particles that are coated with a fusible metal layer in a thermosetting resin. Further yet, U.S. Pat. Nos. 5,977,490 and 5,652,042, the entire contents of the disclosure of both of which is hereby incorporated by reference, describe a conductive paste with copper conductive particles in an epoxy resin.

Conductive paste could be deposited by forcing it into the passages. For example, a conductive paste could be squeegeed into the passages. The conductive paste could then be cured.

In the event that the electrically conducting material filling the passages in the dielectric layer is plated metal, the layer of electrically conducting material on the dielectric layer may represent a continuous conductive layer. This is particularly advantageous in the event that the metal is electroplated. If a conductive paste is utilized, it may be necessary to modify the surface of the fill material to ensure good bonding during joining.

Surface modification could include plating the exposed surface of the conductive paste fill material with a solderable metal, such as copper, tin, nickel, nickel/gold, silver, among others. Modification could alternatively include removing some polymer resin from around conductive particles near the surface to expose more metal for soldering. Polymer removal could be accomplished by plasma etching or chemical etching. For example, the removal could be carried out in alkaline permanganate solution, which is known to those of ordinary skill in the art.

Figure 5:
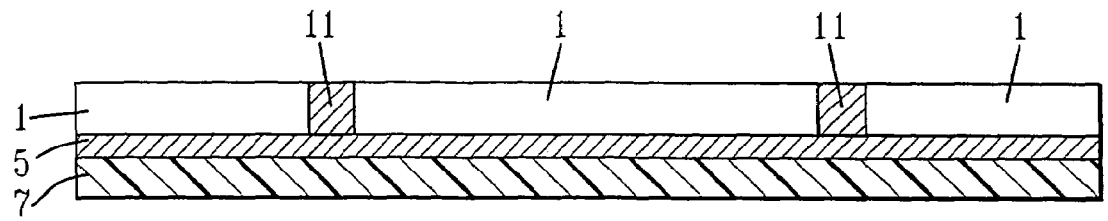

FIG. 5 illustrates the state of the substructure after fill material 11 has been deposited in passages in the dielectric layer 1.

After filling the passages in the dielectric layer, a cap structure may be provided on the electrically conductive material in the at least one passage in the dielectric layer. The cap layer may help to ensure a good electrical connection between substructures joined together as described below. The cap structure may have a thickness of about 0.0001 inch to about 0.0004 inch.

The cap may be comprised of a variety of materials. For example, any metal or alloy may be utilized to form the cap structure. Typically, the material making up the cap is a thin layer of low melting metal or metal alloy (solder). For example, the cap may comprise tin. According to another example, the cap comprises a tin-containing alloy. Other solder alloys may also be used to form the cap structure. Such solder alloys may be compatible with fluxless soldering subsequent to a fluorine containing plasma treatment. Other materials that could be utilized in joining include tin, indium, and gallium, and alloys containing one or more of tin, indium, and gallium. Additional alloying elements can include lead, silver, antimony, bismuth, copper, and gold. Other alloying materials may also be utilized.

Regardless of the material forming the cap, the cap may be provided in a number of different ways. For example, the cap could be provided by plating metal or alloy on the electrically conducting material filling the at least one passage in the dielectric layer. The plating could be electroplating or electroless plating. In the context of forming the cap structure, the plating, whether it is electroless or electroplating would be both maskless and self-aligning.

Figure 6:
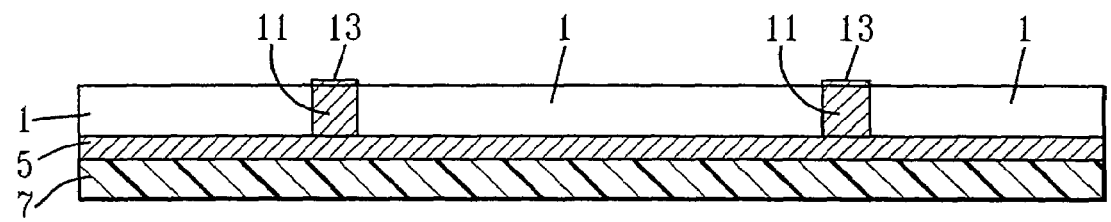
Figure 7:
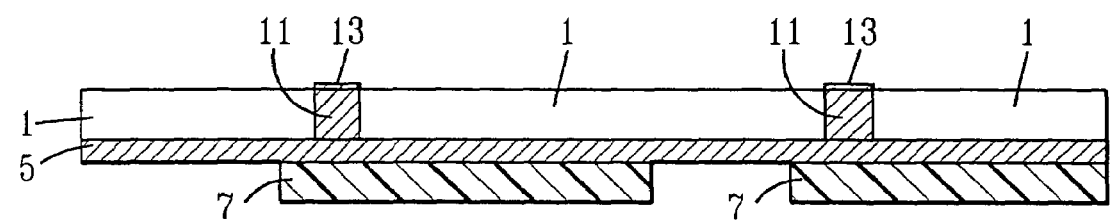

FIG. 6 illustrates the substructure after formation of a cap structures 13 over the electrically conductive fill material 11.

At this point in the process of forming the substructure, portions of the layer of electrically conductive material 5 may be removed to define a pattern a circuitry. To begin this process, the protective layer 7 applied to the electrically conductive material may be removed. A photoresist may then be applied to the layer of electrically conducting material. However, in the event that the protective layer 7 was a photoresist, it may not be removed and may simply then be patterned.

The layer of photoresist on the layer of electrically conducting layer 5 may be exposed to define a pattern of photoresist corresponding to a desired pattern of circuitry to be formed in the electrically conducting layer. After exposure, the photoresist may be developed to form a mask or selective layer covering portions of the layer of electrically conducting material. After development of the photoresist, the electrically conducting layer may be etched to remove portions thereof.

Figure 8:
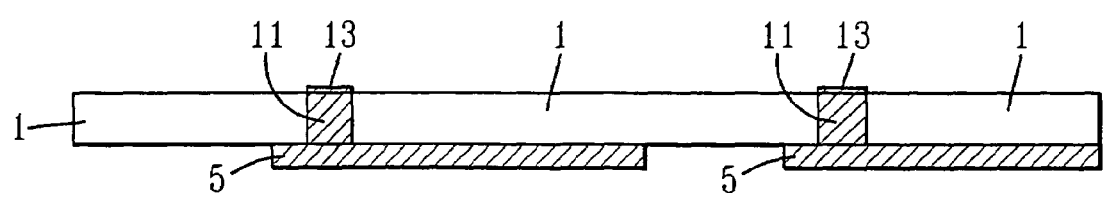

Etching the electrically conducting layer defines circuitry in the electrically conducting layer. After defining the circuitry, remaining portions of the photoresist may be removed. FIG. 8 illustrates the substructure after defining the circuitry in the electrically conducting layer 5.

After forming a plurality of substructures, the substructures may be stacked on top of each other. Prior to stacking and joining substructures, the substructures may be optionally treated to enhance wetting and, thus, yields at joining. Also, the treatment may provide better adhesion of a resin, to be subsequently infused as described below to the circuitry than does the native copper oxide. The optional treatment may include immersion in a tin plating solution.

Optional treatments may also include coating the surface with a triazole or imidazole type organic solderability preservative, which are known to those of ordinary skill in the art and commercially available. Other possible treatments could include microetching and roughening treatments marketed commercially as replacements for the black or brown oxide treatments historically used enhance copper to polymer adhesion on inner layers of multi-layer printed wiring boards. A thin plated layer of nickel, cobalt, tin/nickel alloy, or tin/cobalt alloy may also be effective.

Also prior to stacking and joining the substructures, the circuitized, via filled substructures may be treated in a fluorine-containing plasma. This treatment may be in accordance with the teachings of U.S. Pat. No. 4,921,157; U.S. Pat. No. 5,407,121; and/or U.S. Pat. No. 5,776,551, the entire contents of disclosures of all of which are hereby incorporated by reference. Treatment in the fluorine-containing plasma may be important to obtain metal surfaces, such as tin, solder and/or copper, that can be soldered utilizing lower temperatures. For example, the temperature may be less than about 240θ C. without utilizing a soldering flux. Requiring the use of a soldering flux may increase the complexity and cost of forming the structures according to the present invention. Limiting the use of flux may also eliminate flux residues after joining which could lead to reliability problems.

Figure 9:
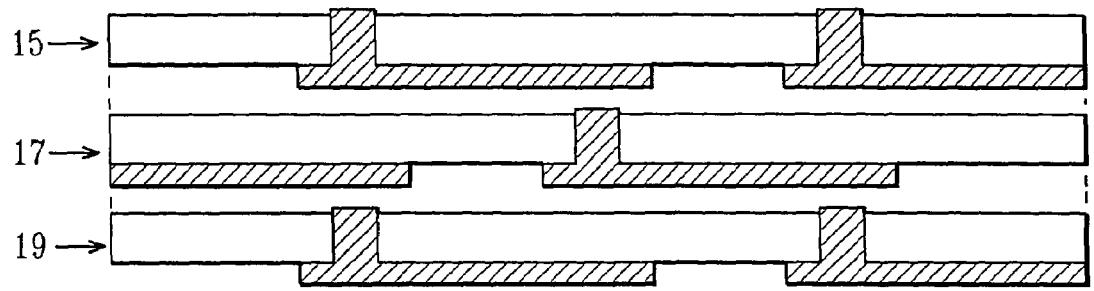
FIGS. 9–11 represent cross sectional views of an embodiment of a plurality of substructures at various stages of an embodiment for joining substructures according to the present invention.

In stacking the substructures, the substructures may be arranged such that the sides of each substructure including the circuitry do not face each other. Such an arrangement is illustrated in FIG. 9, which illustrates three substructures 15, 17 and 19 stacked and aligned prior to joining. As is apparent, after stacking, the substructures may be aligned.

According to some embodiments, the substructures may be arranged such that the at least one contact on one substructure contacts and is electrically conductively joined to the contacts on an adjacent, facing substructure. In other embodiments, the substructures may be arranged such that the at least one contact on one substructure contacts and is electrically conductively joined to the circuitry pattern on an adjacent, facing substructure. With the outermost substructure, either the contacts or the circuitry may face outward, away from the other substructure(s) in the multi-layer structure.

The aligning may take place utilizing a variety of means and methods. For example, the substructures may include slots and pins. Slots and pins, which are standard alignment structures may help to ensure alignment of the circuitry and vias. Optical alignment may also be utilized. Optical alignment may be particularly useful for very dense structures with critical registration tolerances.

To help avoid shifting of the substructures relative to each other during stacking of additional substructures and/or during subsequent handling, the stack of substructures, whether it includes two or more substructures, may be tack soldered. A few joints per square inch may be tack soldered as each new layer is added to the stack. The tack soldering can be accomplished by simply pressing over the joint location with a hot probe, such as fine tipped soldering iron from the circuit side of the layer. Performing the tack soldering from the circuit side of the layer may provide better heat transfer.

After stacking the desired number of substructures on top of each other, the substructures may be joined together. The joining together of the substructure making up the multi-layer structure may be accomplished by heating the structure above the melting point of the solder, which caps the filled vias. Heating can be performed in a batch or conveyorized oven. Alternatively, heating could be carried out between the heated platens. Any heating method could actually be used to join the substructures forming the multi-layer structure.

Simultaneously with heating the multi-layer structure, pressure may be applied to the stack. The pressure can be applied by parallel plates above and/or below the stack of substructures. Typically, the pressure is not greater than the pressure required to ensure contact of surfaces to be joined. Along these lines, the pressure may from about 0 psi to about 100 psi. Typically, the pressure is about 0 psi to about 20 psi. Joining the substructures of the multi-layer structure typically does not require a traditional laminating press.

Joining the substructures can be carried out in any atmosphere. For example, the atmosphere could be ambient. The atmosphere could also include an inert gas, such as nitrogen or another inert gas.

Alternatively, the joining could be carried out in a vacuum. Application of a vacuum at some point during joining of the substructures at joining temperatures may improve the escape of any materials volatilized during the joining process.

Figure 10:
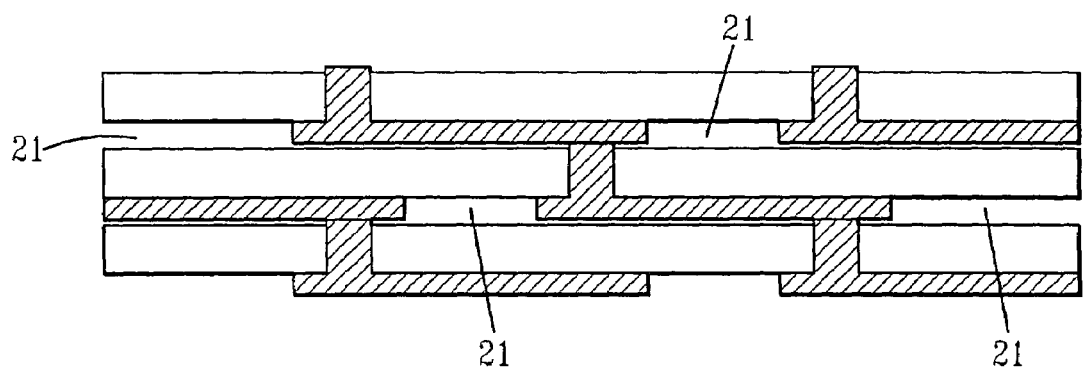

FIG. 10 illustrates an example of a multi-layer structure including three substructures that have been joined together. As can be seen in FIG. 10, open spaces 21 exist between the substructures. Open spaces 21 between the substructure may be substantially filled with electrically insulating material. The electrically insulating material may be a low viscosity thermosetting resin. The electrically insulating material typically substantially fills the space between adjacent, facing substructures and between conductors and between conductors and dielectric layers within a stack of substructures.

Typically, the materials have a low viscosity so that they flow into the narrow gaps between the substructures, and they have to be transformable into solid materials after fill is complete in order to have a usable final structure. Such materials can include thermosetting resins that polymerize to form long chains or cross-linked materials. Additionally, the polymerization reaction typically does not produce low molecular weight by products, such as, for example, polyamic acids that release water when they polymerize to polyimides. Some suitable material classes include anhydride cured cycloaliphatic epoxies, urethanes, and silicones.

If a low viscosity thermosetting resin is utilized to fill the spaces between the joined layers, it may be vacuum infused into the spaces 21 between the layers. Vacuum infusing may be carried by a vacuum bagging process. According to this process, a gas impermeable, flexible covering is placed on the structure. The covering may then be sealed around the top and bottom periphery of the structure.

At least one vacuum and at least one resin port are provided in the cover. Typically, the cover includes a series of vacuum end resin supply ports. The series of ports may be generally opposed. Also, the port or ports may be placed around the edges of the joined structure.

Figure 11:
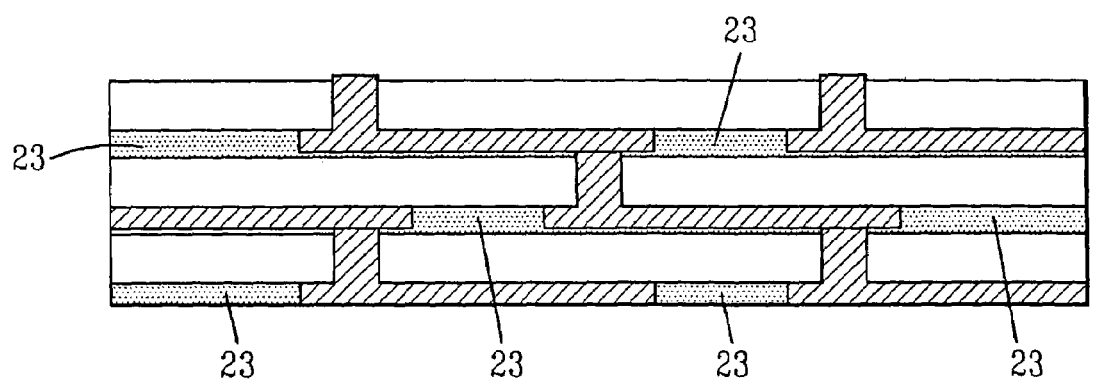
Figure 12:
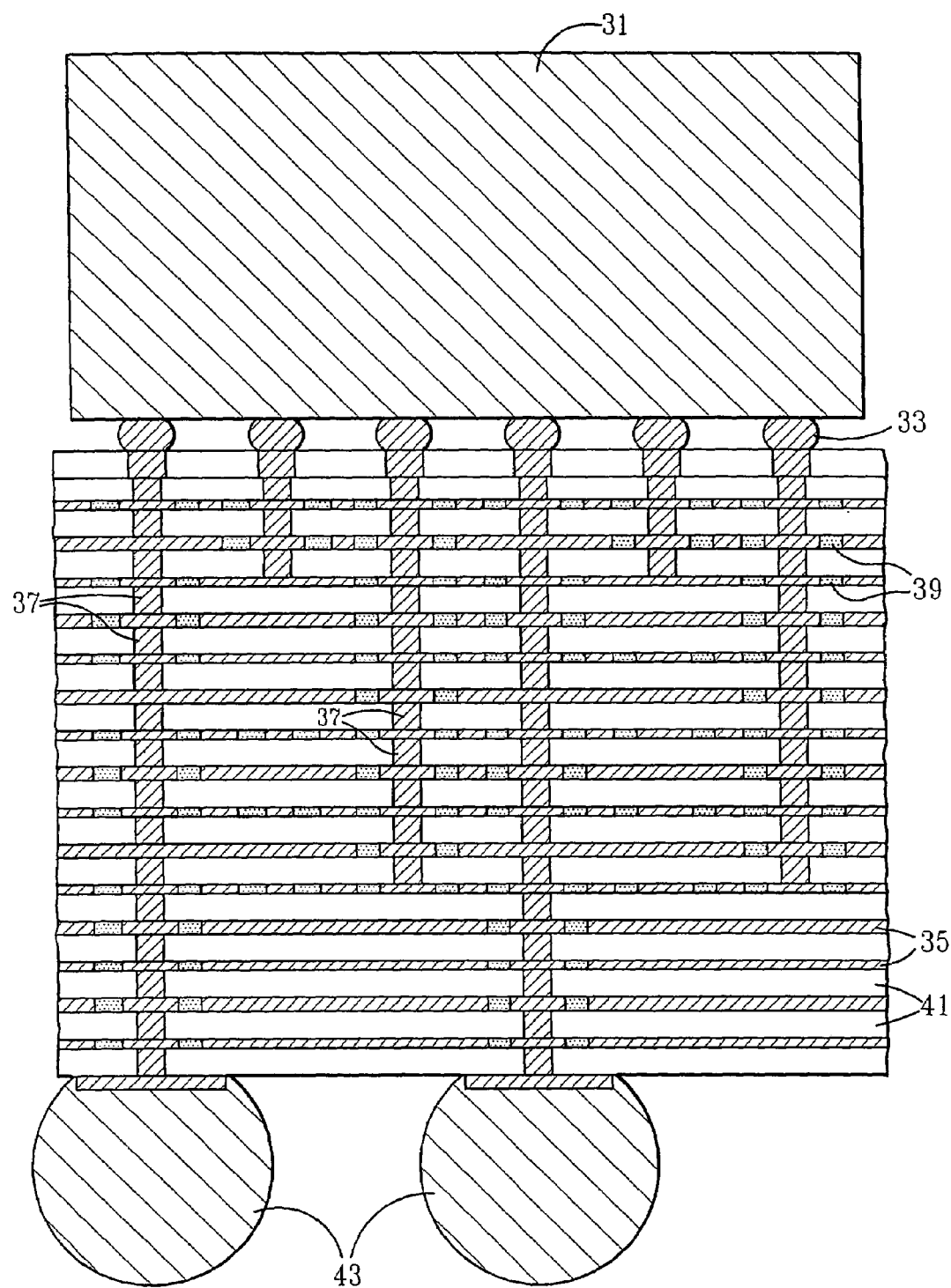
FIG. 12 represents a cross sectional view of an embodiment of an electronic package according to the present invention, which includes an embodiment of a multi-layer structure according to the present invention.

Surface tension and atmospheric pressure pushing on the resin supply cause the resin to flow into all of the open areas 21 between the substructures. After introducing the resin into the open structures, the resin may be thermally cured, resulting in a monolithic structure. FIG. 11 illustrates an embodiment of a multi-layer structure according to the present invention after infusing resin into open spaces between the substructures making up the multi-layer structure.

After introducing electrically insulating material in spaces between the substructures joined together, the multi-layer structure may be drilled, plated, and/or circuitized. The drilling, plating, and/or circuitization may be carried utilizing standard printed wiring board processes. Drilling, plating, and/or circuitizing may permit mounting of pin-n-hole components. Mounting holes may be drilled in the multi-layer structure. Also, the multi-layer structure may be utilized as a core/subcomposite in a higher level laminated interconnect structure.

Further operations that may be carried out on the multi-layer structure may be similar to those utilized for traditional printed wiring boards. The finishing operations can include application of the solder mask, modifying the surface finish, such as using an organic solder preservative, Ni/Au plating, solder coating among other processes, testing and machining to final outline among other processes. Any of the above or other finishing operations can be applied as needed with the same wide variety of sequences as applicable to ordinary printed wiring boards.

After forming a multi-layer structure according to the present invention, the multi-layer structure may be incorporated into an electronic package. Forming an electronic package according to the present invention may include forming a multi-layer structure as described above and then joining the multi-layer to another structure, such as a chip. The chip or other structure may be joined to the multi-layer structure according to the present invention according to processes similar to processes for joining of a chip or other structure to a chip carrier, printed wiring board, or other structure such as those described above.

It follows from the above that the present invention also includes a multi-layer electronic structure. The multi-layer electronic structure includes at least two prefabricated substructures joined together. Each substructure includes a layer of dielectric material having a top surface and a bottom surface. The pattern of circuitry is arranged on one of the top surface and the bottom surface of the layer of dielectric material. At least one passage filled with electrically conducting material exists in the dielectric layer in connection with the circuitry.

The circuitry patterns on the dielectric layers do not directly contact each other and do not face each other. Electrically insulating material is arranged between adjacent faces of adjacent substructures except between a joined filled passage and dielectric material and a circuitry pattern.

The materials described above may be utilized in a multi-layer electronic structure according to the present invention. Therefore, these materials will not be repeated here.

Similarly, the present invention also includes an electronic package including a multi-layer structure such as that described above and a semiconductor chip.

Among the advantages of the present invention are that it includes relatively few and simple process steps. Also, the present invention may be carried out utilizing little or no high cost materials. This can lead to higher yields and lower costs.

The present invention provides an organic analogue to multi-layer ceramic (MLC) structures. However, the present invention can provide interconnect density equivalent or higher than MLC structures and at a lower cost than other organic alternatives. The present invention is also especially useful for products requiring high levels of interconnect density or miniaturization, where minimization of weight or volume is important. Such issues may be important where a structure according to the present invention is utilized in applications where a printed wiring board (PWB) may traditionally be utilized. The present invention can also provide for a localized area of high density interconnects where needed without forcing the entire structure to be built at premium costs required for the high density area.

Another advantage of the present invention includes that production of the individual layers can readily adapted to both panel processing and roll processing manufacturing tool sets.

Also, the present invention provides a practical, cost effective method for parallel joining of multi-layer organic dielectric interconnect structures which has long been sought in the electronics industry. Known proposed solutions to this problem suffer from one or more major deficiencies which has prevented there wide spread adoption in the electronics industry. The present invention does not suffer from these problems, such as those associated with gold bonding and conductive paste bonding.

Furthermore, the present invention avoids yield, cost, and cycle time problems associated with sequential build-up processes, which are the most common methods of fabricating high density interconnect structures (HDIS). Also, the present invention provides a method of electrically and mechanically joining adjacent circuit layers that does not require that the supporting dielectric of the individual areas be self-bonding. In other words, the present invention does not require adhesive coated dielectric sheets or dielectrics containing uncured resin. Still further, the present invention does not require the use of adhesive sheets or films. Such sheets or films would have to be patterned to match the layer to layer via pattern.

The present invention also has the advantage of making connections between circuit on adjacent layers prior to bonding of the dielectric of one layer to the dielectric or circuitry of an adjacent layer. On the other hand, conventional multi-layer circuit boards typically are formed by joining dielectric first, such as by lamination, with sticker sheets, followed by forming circuit layer interconnections, such as by drill and plate. Even newer, parallel methods of multi-layer construction that employ simultaneous dielectric and circuit joining, such as sticker sheets with conductive paste filled via holes, suffer from dimensional stability and/or displaced volume control problems that can cause severe manufacturing difficulties. The present invention does not suffer from these problems or difficulties.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A parallel joining technology method for making a multi-layer electronic structure, the method comprising:
   providing a plurality of sub-composites, wherein each said sub-composite is formed by the steps of:
      providing a layer of dielectric material having a first surface and a second surface, wherein said first surface is selected from the group consisting of a top surface and a bottom surface,
      providing a layer of electrically conducting material on said first surface;
      forming at least one blind via comprising a passage from said second surface through said dielectric layer to expose said layer of electrically conducting material facing said dielectric layer;

depositing electrically conducting metallurgical material in at least one of said blind vias wherein said electrically conducting layer is in electrical contact with said electrically conductive metallurgical material in said at least one blind via;

removing portions of the layer of electrically conducting material to define a pattern of circuitry;

stacking a plurality of said sub-composites, wherein a void is defined between adjacent sub-composits;

aligning said plurality of sub-composites;

joining said plurality of sub-composites such that the electrically conducting metallurgical material in at least one of said blind vias makes electrical contact by forming a metallurgical bond to the conductive pattern on an adjacent sub-composite;

flowing an un-cured resin into said voids, and forming an electric insulator by curing said resin.

2. The method according to claim 1, wherein a layer of electrically conducting material is provided on both the top surface and the bottom surface of the layer of dielectric material, the method further comprising removing a layer of conductive material on one of the top and bottom surface.

3. The method according to claim 1, wherein the layer-of electrically conducting material is patternable is solderable or can have a solderable surface layer applied.

4. The method according to claim 1, wherein the layer of electrically conducting material comprises at least one metal.

5. The method according to claim 1, wherein the layer of electrically conducting material comprises copper.

6. The method according to claim 1, wherein the layer of electrically conducting material is provided by a method selected from the group consisting of lamination, physical vapor deposition, plating, and chemical vapor deposition.

7. The method according to claim 6, wherein the physical vapor deposition comprises vacuum evaporation or sputtering.

8. The method according to claim 6, wherein the plating comprises electroplating or electroless plating.

9. The method according to claim 1, wherein the layer of dielectric material is provided by applying dielectric material to the layer of electrically conducting material.

10. The method according to claim 9, wherein the electrically conducting material comprises copper.

11. The method according to claim 9, wherein the dielectric material is applied to an electrically conductive foil by a method selected from the group consisting of screening, slot coating, curtain coating, doctor blading, roll coating, rod coating, dip coating, and spraying.

12. The method according to claim 1, further comprising:
applying a layer of a protective material on the layer of electrically conducting material.

13. The method according to claim 12, wherein the protective material is photoresist.

14. The method according to claim 1, wherein the at least one passage through the dielectric layer is formed by laser drilling or plasma etching.

15. The method according to claim 1, wherein the electrically conducting metallurgical material deposited in at least one of the at least one passage through the dielectric layer does not extend beyond an opening of the at least one passage.

16. The method according to claim 1, wherein the electrically conducting metallurgical material deposited in at least one of the at least one passage through the dielectric layer at least partially extends beyond an opening of the at least one passage.

17. The method according to claim 1, further comprising:
providing a cap on the electrically conducting metallurgical material in the at least one passage.

18. The method according to claim 17, wherein the cap comprises tin.

19. The method according to claim 17, wherein the cap comprises a tin-containing alloy.

20. The method according to claim 17, wherein the cap has a thickness of about 0.0001 inch to about 0.0004 inch.

21. The method according to claim 17, wherein the cap is provided by plating an electrically conducting material on the electrically conducting material in the at least one passage.

22. The method according to claim 21, wherein the plating is electroplating or electroless plating.

23. The method according to claim 21, wherein the plating is maskless and self-aligning.

24. The method according to claim 1, further comprising:
applying a protecting coating over the layer of electrically conducting material on the dielectric layer, wherein the protecting layer is removed prior to removing portions of the layer of electrically conducting material to define a pattern of circuitry.

25. The method according to claim 1, wherein removing portions of the layer of electrically conducting material to define a pattern of circuitry comprises depositing a layer of photoresist on the layer of electrically conducting material, exposing the photoresist, developing the photoresist to form a mask for selectively removing portions of the layer of electrically conducting material, and removing remaining portions of the photoresist.

26. The method according to claim 1, flier comprising:
treating the layer of dielectric material and the pattern of circuitry with an immersion in plating solution.

27. The method according to claim 1, further comprising:
treating the layer of dielectric material and the pattern of circuitry in a fluorine-containing plasma.

28. The method according to claim 1, wherein the structures are aligned with at least one of aligning pins and aligning marks.

29. The method according to claim 1, wherein the structures are stacked one-by-one and each time another structure is added to the stack it is soldered to a structure in the stack.

30. The method according to claim 1, wherein forming a metalurgical bond comprises heating the structures to a temperature above a melting point of at least one of the constituent of, or the cap deposited on, the electrically conducting metallurgical material deposited in the at least one passage in the dielectric layer.

31. The method according to claim 30, wherein joining the structures further comprises applying pressure to the stack from above and below.

32. The method according to claim 30, wherein the joining is carried out in an atmosphere that is inert under the conditions that the joining is carried out under.

33. The method according to claim 30, wherein the joining is carried out in a nitrogen atmosphere.

34. The method according to claim 30, wherein the joining is carried out under a vacuum.

35. The method according to claim 1, wherein the spaces between the structures are filled with a low viscosity, thermosetting resin.

36. The method according to claim 35, wherein filling the spaces comprises arranging a gas impermeable flexible covering about the plurality of structures, sealing a periphery of the plurality of structures in the vicinity a top and a bottom surface of the plurality of structures, and introducing the resin into the covering.

37. The method according to claim 36, wherein after introduction the resin is cured.

38. The method of claim 1 wherein said electrically conducting metallurgical material comprises a material selected from the group consisting of a plated metal, a plated alloy, a conductive paste having metal particles, at least a portion of which are fusible, present in a volume fraction above a percolation threshold, a conductive paste having fusible metal particles, and a conductive paste having metal particles coated with a fusible metal coating.

39. The method according to claim 38, wherein the dielectric material is selected from the group consisting of free standing organic film, fiber reinforced resin sheet, particulate filled fluoropolymer sheet, or resin filled expanded fluoropolymer sheet.

40. The method according to claim 39, wherein the free standing organic film is polyimide film.

41. The method according to claim 39, wherein the free standing organic film is a liquid crystal polymer film.

42. The method according to claim 39, wherein the fiber reinforced resin sheet includes at least one of glass, aramid, and liquid crystal polymer fibers and the fibers are woven or non-woven.

43. The method according to claim 38, wherein the electrically conducting metallurgical material is deposited in at least one of the at least one passage through the dielectric layer by plating or introducing electrically conducting paste into the at least one passage.

44. The method according to claim 43, wherein the electrically conducting metallurgical material is deposited in at least one of the at least one passage through the dielectric layer by plating and the plating is electroplating or electroless plating.

45. The method according to claim 38, wherein the electrically conducting metallurgical material is deposited in at least one of the at least one passage through the dielectric layer by introducing electrically conducting paste into the at least one passage, wherein the introduction of the electrically conducting paste comprises forcing the conducting paste into the at least one passage and curing the conducting paste.

46. The method according to claim 45, wherein forcing the conducting paste into the at least one passage comprises squeegeeing the conducting paste.

47. A parallel joining technology method for making a multi-layer electronic interconnect structure, the method comprising:
providing a layer of dielectric material bonded to a layer of electrically conductive material, the layer of dielectric material having substantially uniform thickness;
forming at least one passage through the layer of dielectric material to expose a portion of the layer of electrically conductive material;
depositing electrically conducting metallurgical material in at least one of the at least one passage through the layer of dielectric material, such that the electrically conducting metallurgical material in the at least one passage is in electrical contact with the layer of electrically conducting material bonded to the layer of dielectric material and extends beyond a surface of the layer of dielectric material;
removing portions of the layer of electrically conducting material to define a pattern of circuit conductors, such that at least one of the circuit conductors remains electrically connected to the electrically conductive metallurgical material deposited in that at least one of the at least one passage through the layer of dielectric material;
stacking and aligning a plurality of structures comprising the layer of dielectric material with circuit conductors disposed thereon and conductively filled passages therethrough such that one of the following conditions exists:
a) at least one conductively filled passage in a structure contacts at least one circuit conductor on the conductive layer of an adjacent structure;
b) at least one circuit conductor on the conductive layer of a structure contacts at least one conductively filled passage in an adjacent structure; or
c) at least one conductively filled passage in a structure contacts at least one conductively fined passage in an adjacent structure;
electrically and mechanically joining the electrically conductive metallurgical material filling one of the at least one passage that is aligned with an electrically conductive feature on an adjacent structure to the adjacent structure conductive features;
filling the space between adjacent structures with an uncured resin; and
forming an electrical insulator by curing said resin.

48. The method according to claim 47, wherein the electrically insulating material used to fill spaces between the adjacent structures comprises a liquid which is transformed into a solid subsequent to filling the spaces.

49. The method according to claim 48, wherein the transformable insulating material is an organic resin.

50. The method according to claim 49, wherein the organic resin includes at least one member selected from the group consisting of epoxy, acrylic, cyanate ester, urethane, polyester, bismaleimide triazine, silicone, and mixtures or copolymers thereof.

51. The method according to claim 49, wherein the transformable electrically insulating material comprises at least one inorganic particulate filler in an amount up to about 60 percent by volume.

52. The method according to claim 49, wherein the transformable electrically insulating material is converted to a solid by at least one means selected from the group consisting of chemical polymerization and cross linking reactions.

53. The method according to claim 47, wherein filling spaces between adjacent structures comprises introducing a liquid electrically insulating material into the spaces and allowing capillary forces to transport the liquid from a point of introduction throughout the spaces.

54. The method according to claim 53, wherein the liquid electrically insulating material is introduced at least one point around peripheries of the layers of dielectric material.

55. The method according to claim 53, wherein the liquid electrically insulating material is introduced at a pressure greater than atmospheric pressure in order to provide a larger driving force for material transport than provided by capillary forces alone.

56. The method according to claim 53, wherein a vacuum is created and maintained in spaces between tie adjacent structures during a time when the liquid electrically insulating material is being introduced.

57. The method according to claim 56, further comprising:
arranging a gas impermeable flexible covering about the plurality of structures;

sealing the flexible covering to the plurality of structures about top and bottom peripheries of the structures;

evacuating the atmosphere from within the flexible covering;

introducing a liquid electrically insulating material into the evacuated covering in the vicinity of at least one edge of the plurality of structures;

allowing the liquid electrically insulating material to fill the spaces between structures;

transforming the liquid electrically insulating material into a solid; and removing the gas impermeable covering.

* * * * *